United States Patent [19]

Mori et al.

[11] 4,375,993
[45] Mar. 8, 1983

[54] METHOD OF PRODUCING A SEMICONDUCTOR DEVICE BY SIMULTANEOUS MULTIPLE LASER ANNEALING

[75] Inventors: Haruhisa Mori; Hajime Kamioka; Motoo Nakano, all of Yokohama; Nobuo Sasaki, Kawasaki, all of Japan

[73] Assignee: Fujitsu Limited, Kawasaki, Japan

[21] Appl. No.: 252,216

[22] Filed: Apr. 8, 1981

[30] Foreign Application Priority Data

Apr. 9, 1980 [JP] Japan ................... 55-45694

[51] Int. Cl.³ ............... H01L 21/263; H01L 21/265; H01L 29/78
[52] U.S. Cl. .................. 148/1.5; 29/576 B; 148/187; 357/91; 427/53.1
[58] Field of Search .............. 148/1.5, 187; 427/53.1; 357/91; 29/576 B

[56] References Cited

U.S. PATENT DOCUMENTS

| | | | |
|---|---|---|---|
| 4,229,232 | 10/1980 | Kirkpatrick | 148/1.5 |
| 4,234,356 | 11/1980 | Auston et al. | 148/1.5 |
| 4,249,960 | 2/1981 | Schnable et al. | 148/1.5 |
| 4,272,880 | 6/1981 | Pashley | 29/571 |
| 4,292,091 | 9/1981 | Togei | 148/1.5 |
| 4,309,224 | 1/1982 | Shibata | 148/1.5 |

FOREIGN PATENT DOCUMENTS

144481 10/1980 Fed. Rep. of Germany.
55-67132 5/1980 Japan .................... 29/576 B

OTHER PUBLICATIONS

Ho et al., IBM-TDB, vol. 19, (Apr. 1977), 4438.
Cohen et al., Appl. Phys. Letts. 33, (Oct. 1978), 751.
Kamins et al., IEEE-Trans:Electron Devices, ED-27, (Jan. 1980), 290.
Tasch et al., Electron Letters, 15, (1979), 435.
Petersen, IBM-TDB, 22, (Apr. 1980), 5053.
Lam et al., IEEE-Electron Device Meeting, Wash., 1979, p. 213.
Fang et al., IBM-TDB, 23, (Jun. 1980), 362.
Shah et al., IEEE-Electron Device Meeting, Washington, 1979, p. 216.
Kamins et al., IEEE-Electron Device Letts. EDL-1, (Oct. 1980), p. 214.
Auston et al., Appl. Phys. Letts. 34, (1979), 558.
Hutchins et al., IBM-TDB, 15, (1974), 3488.

*Primary Examiner*—Upendra Roy
*Attorney, Agent, or Firm*—Staas & Halsey

[57] ABSTRACT

A method of producing a semiconductor device which comprises steps of forming an insulator layer on a semiconductor substrate, forming a semiconductor layer on the insulator layer and then annealing the semiconductor layer by means of a first laser with a second laser being applied to the insulator layer to heat it while the first layer is applied to the semiconductor laser.

22 Claims, 4 Drawing Figures

METHOD OF PRODUCING A SEMICONDUCTOR DEVICE BY SIMULTANEOUS MULTIPLE LASER ANNEALING

BACKGROUND OF THE INVENTION

1. Field of the Invention

The present invention relates to a method of producing a semiconductor device which comprises a step of annealing, and in particular to a method of producing a semiconductor device which comprises a step of annealing an amorphous or polycrystalline silicon layer formed on a silicon dioxide layer.

2. Description of the Prior Art

It is often necessary to anneal defective crystals for the purpose of removing the defects induced by the ion implantation, or for the purpose of increasing the grain size of polycrystalline silicon. It is known that a beam applying process, for example a beam generated by means of a large output laser, has been used as an annealing process. For example, a yttrium Aluminum Garnet (hereinafter referred to as YAG) laser, ruby laser, argon laser, etc., which have a large optical absorption coefficient in an amorphous or polycrystalline silicon, have been used as the lasers for annealing of the ion implanted amorphous or polycrystalline silicon. There are two processes using a laser. One is pulse oscillation and the other is continuous wave (hereinafter referred to as CW) oscillation. The process using a YAG laser or ruby laser belongs to the former, and the process using an argon laser belongs to the latter. It is further known that a buried oxide metal oxide semiconductor (so called BOMOS) wherein the source, drain and gate of a MOS-FET are formed on a single crystalline layer, and the electrode and conductor pattern of the source and the drain are formed on a polycrystalline silicon layer, is superior to the usual bulk MOS device because BOMOS is able to reduce the junction capacitance between the source or drain region and the silicon substrate. In a structure wherein a silicon layer is deposited on a partially opened silicon dioxide layer which is formed on a single crystal silicon substrate, the silicon formed on the silicon dioxide layer may be a polycrystalline silicon layer and the silicon deposited on the single crystal silicon substrate has to be a single crystal silicon layer.

An example in which a conventional laser annealing process is applied to a structure in which a silicon dioxide layer and a polycrystalline silicon layer are successively formed on a single crystal silicon substrate will be explained with reference to FIG. 1. Referring to FIG. 1, a silicon dioxide layer 2 is formed on a single crystal silicon substrate 1 and further a polycrystalline silicon layer 3 is formed on the silicon dioxide layer 2. A laser beam (hereinafter referred to as the first laser) 5 is applied to the surface of the polycrystalline silicon layer 3 by reflecting it from a surface of a mirror 4 for laser annealing. Any laser of YAG or ruby or argon can be used as the first laser beam 5. When an annealing heat treatment is carried out by applying the laser beam 5 to the surface of the polycrystalline silicon layer 3 and thus heating it to a high temperature of from 1000° C. to 1500° C. for an instant, for example, in a range of ns (nanoseconds), the polycrystalline silicon layer 3 is melted and is rapidly cooled after the laser applying process is completed. In the rapid cooling a problem of thermal strain occurs due to the temperature difference of about 1000° C. between the polycrystalline silicon layer 3 and the silicon dioxide layer 2. Defects, such as orange peel pattern, point defects, etc., may therefore be generated on the polycrystalline silicon layer 3. In order to reduce the above mentioned thermal strain, the single crystal substrate 1 is preliminarily heated to a temperature of ranging from 300° to 500° C. by means of a heater. However, when this preliminary heating is carried out, the advantages of the laser annealing technique using non thermal equilibrium process at a low temperature (i.e., high electrical activity, ease of handling, low possibility of contamination, etc.) are minimized. In the non-thermal equilibrium process, more impurities are electrically activated than in thermal equilibrium solid solubility. Therefore, the preliminary heating temperature of the single crystal silicon substrate 1 has a limitation and thus, the occurrence of the thermal strain between the polycrystalline silicon layer 3 and silicon dioxide layer 2 is not sufficiently prevented. The time necessary for the activation process, i.e., accepting implanted ions into the substitutional position in the substrate, is very short such as, from several hundreds ns to several $\mu$s. Implanted ions have a tendency to possess a substitutional position with high proportion and have a high activation rate.

However, the ions are in a non equilibrium state when they are implanted and annealed by laser. When the single crystal layer 1 is heated to a high temperature by means of a heater, the ion-implanted and laser-annealed ions are present at the substitutional position or the interstitial position so that the ions are in thermal equilibrium. In this case the proportion of the substitutionals is not so high as the non-heated case. Since the interstitial ions are electrically nonactive, the activation rate of the implanted ions is, as a whole, lowered.

SUMMARY OF THE INVENTION

Accordingly, it is an object of the present invention to provide a method of producing a semiconductor device wherein thermal strain between a polycrystalline silicon layer and a silicon dioxide layer is reduced as compared to the prior art.

It is another object of the present invention to provide a method of producing a semiconductor device wherein the electric resistance of an amorphous or polycrystalline silicon layer formed on a silicon dioxide layer is reduced.

According to the present invention the foregoing objects are achieved by providing a method of producing a semiconductor device which comprises steps of forming an insulator layer on a semiconductor substrate, forming a semiconductor layer on the insulator layer and then annealing the semiconductor layer by means of a first laser beam, the method being characterized in that a second laser beam is applied to said insulator layer to heat said insulator layer while the first laser is applied to the semiconductor layer.

DETAILED DESCRIPTION OF THE PREFERRED EMBODIMENT

Figure 1:
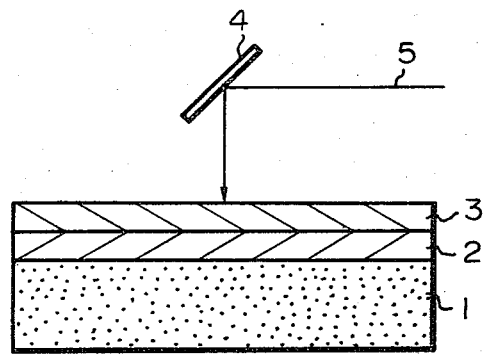
FIG. 1 is a schematic cross sectional view of a conventional method of laser annealing.
Figure 2:
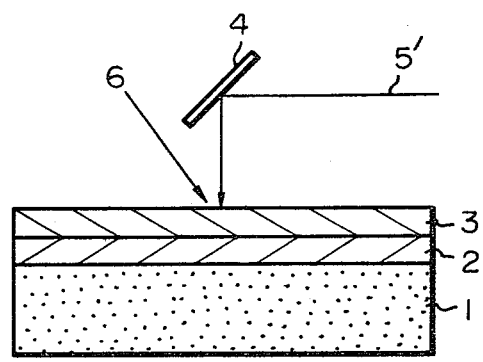
FIG. 2 is a schematic cross sectional view of a method of laser annealing according to the present invention.

As is easily understood from FIG. 2, as compared with FIG. 1 which illustrates a conventional method of laser annealing, the laser annealing method of the present invention is characterized in that a second laser beam 6 is further applied in addition to a first laser beam 5' used in the conventional method. An insulator layer 2, for example, silicon dioxide, alumina or a sapphire layer, etc., having a thickness of 1 $\mu$m, is formed on a semiconductor substrate 1 having a thickness of 300 to 600 $\mu$m. Then, a semiconductor layer 3, such as an amorphous or polycrystalline silicon layer, is deposited to a thickness of 0.2 to 1 $\mu$m on the insulator layer 2 by an evaporation process or a chemical vapor deposition (CVD) process. Then, the first laser beam 5' reflected by a mirror 4 is radiated to the region of the semiconductor layer 3. When a YAG or ruby laser of a pulse oscillation type is used as the first laser, a pulse laser of carbon dioxide ($CO_2$) is used as the second laser. When an argon laser of a CW oscillation type is used as the first laser, a CW laser of $CO_2$ is used as the second laser. In using the above mentioned pulse oscillation, it is preferable that the radiation energy density of the laser annealing be 1 to 4 joule/cm$^2$ in a YAG laser, 1 to 2 joule/cm$^2$ in a ruby laser and 0.2 to 2.0 joule/cm$^2$ in a $CO_2$ laser with laser applying times of 10 to 90 ns, 10 to 90 ns and 10 to 900 ns, respectively. In using the above mentioned CW oscillation laser, it is preferable that the power of laser annealing be 5 to 20 W in an argon laser and 10 to 90 W, in particular 50 W, in a $CO_2$ laser.

The polycrystalline silicon layer 3 is heated to a temperature of about 1400° C. by applying a ruby laser while the silicon dioxide layer 2 is heated to a temperature of 1000° to 1400° C. by applying a $CO_2$ laser. Therefore, it is possible to keep the temperature difference between the polycrystalline silicon layer 3 and the silicon dioxide layer 2, within a temperature of 400° C.

According to the present invention the following effects are obtained.

(1) When a $CO_2$ second laser is not used, only an amorphous or polycrystalline silicon layer is heated. Therefore on the subsequent rapid cooling, a defect, namely a large thermal strain occurs between the amorphous or polycrystalline silicon layer and the silicon dioxide layer. However, the thermal strain between polycrystalline silicon layer and the silicon dioxide layer is reduced by positively heating the silicon dioxide layer and thus minimizing the defects in the semiconductor layer, such as an orange peel pattern caused by the thermal strain.

(2) If the bore of the second laser beam having the same or a larger bore than that of the first laser beam is used, a polycrystalline silicon having a large crystal size grows on the silicon dioxide layer. When this polycrystalline silicon is used as a conductor pattern material, the resistance of the material is reduced and the consumption of electric power can be advantageously decreased while the working speed of the device can be increased.

Figure 3:
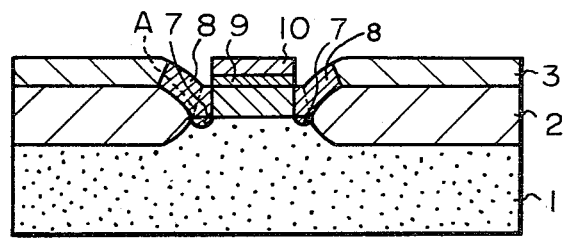
FIG. 3 is a cross sectional view of an important part of a conventional type of BOMOS.
Figure 4:
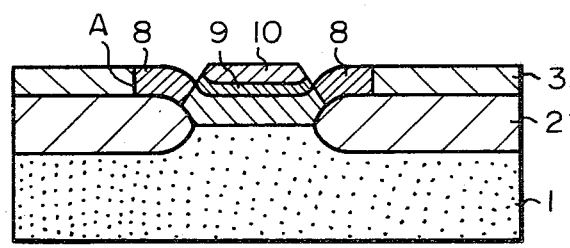
FIG. 4 is a cross sectional view of an important part of a type of BOMOS according to the present invention.

(3) The temperature difference between the polycrystalline silicon layer and the silicon dioxide layer is kept within a temperature of 400° C., while the temperature difference between the polycrystalline silicon layer and the silicon substrate is larger than this temperature. As a result, cooling of the annealed layer is carried out from an opening in the silicon dioxide layer and proceeds toward the non-open areas. Then a region of the single crystal layer larger than the opening of the silicon dioxide layer is made in the polycrystalline silicon layer after the laser radiation to the silicon layer is completed. In a conventional type of BOMOS as shown in FIG. 3, parts 7 of source and drain regions 8 are formed in the silicon substrate 1. However, in a type of BOMOS according to the present invention as shown in FIG. 4, the source and the drain regions 8 can be positioned on the silicon dioxide layer 2. Furthermore, since a junction capacitance between the source or drain region and the silicon substrate is reduced, a higher speed BOMOS is obtained, and a power loss is reduced. Reference numeral 9 shows a gate insulator layer and reference numeral 10 shows a gate.

(4) In order to reduce the thermal strain and point defects, preliminary heating of the whole substrate at a temperature of 300° C. to 500° C. is performed in the conventional cases. But in the present invention, such heating is not needed.

Since the rate of $CO_2$ laser energy absorption in the single crystal silicon substrate is small such as under 10%, the $CO_2$ gas laser beam may be radiated not only from above the polycrystalline silicon layer 3 but also from underneath the single crystal substrate 1. The $CO_2$ laser should be carried out at a region which includes the region to which the first laser beam is applied. It is necessary that the optical axis of the $CO_2$ laser which is applied from underneath the semiconductor substrate does not pass through the mirror 4 for the purpose of preventing the mirror from being heated.

EXAMPLE 1

A silicon dioxide layer having a thickness of 1 $\mu$m was formed on a silicon substrate having a thickness of 500 $\mu$m by means of thermal oxidation treatment and some openings are made by etching off portions of the silicon dioxide. A polycrystalline silicon layer having a thickness of 1 $\mu$m was then formed on the sample by the CVD process. Then, an argon laser beam was radiated to the polycrystalline layer at a power of 10 W and at a scanning speed of 10 cm/sec. The diameter of the applied spot area at the polycrystalline layer was 100 $\mu$m. A $CO_2$ laser beam was applied to the silicon dioxide layer at a power of 50 W as a second laser beam. As a result, a single crystal growth of 60 $\mu$m from the opening edge of the silicon dioxide layer 2 was obtained.

EXAMPLE 2

A silicon dioxide layer having a thickness of 0.8 $\mu$m was formed on a silicon substrate having a thickness of 600 $\mu$m by means of thermal oxidation treatment. A polycrystalline silicon layer having a thickness of 0.9 $\mu$m was then formed on the silicon dioxide layer by the CVD process. Then, As$^+$ was implanted into a desired region of the polycrystalline silicon layer at an energy of 100 kev and a density of $1 \times 10^{15}$/cm$^2$, then, a YAG pulse laser having a pulse of 20 ns was applied to the polycrystalline layer at an energy density of 4 joule/cm$^2$ so as to anneal the layer. At the time of applying the YAG laser beam to the polycrystalline silicon layer, a $CO_2$ pulse laser beam was applied to the silicon dioxide layer at an energy density of 2 joule/cm$^2$. As a result, the value of electric resistance was reduced to $10^2 \Omega/\square$ from $10^4 \Omega/\square$ which was obtained by the YAG pulse laser alone.

What is claimed is:

1. A method of producing a semiconductor device which comprises the steps of:
   (a) forming an insulator layer on a semiconductor substrate;
   (b) forming a semiconductor layer on the insulator layer; and,
   (c) then annealing the semiconductor layer by means of a first laser with a second laser being applied to said insulator layer to heat said insulator layer while the first laser is applied to the semiconductor layer.

2. A method of producing a semiconductor device according to claim 1, wherein said second laser is a carbon dioxide laser.

3. A method of producing a semiconductor device according to claim 1, wherein said second laser is applied to a region of said insulator layer, said region including a region to which the first laser is applied.

4. A method of producing a semiconductor device according to claim 1, wherein said insulator layer includes at least one material selected from the group comprising silicon dioxide, alumina and sapphire.

5. A method of producing a semiconductor device according to claim 1, wherein said insulator layer has a thickness in the range of approximately 0.1 $\mu$m to 2 $\mu$m.

6. A method of producing a semiconductor device according to claim 1, wherein said substrate has a thickness in the range of approximately 300–600 $\mu$m.

7. A method of producing a semiconductor device according to claim 1, wherein said semiconductor layer is formed by chemical vapor deposition and includes at least one of the materials selected from the group comprising amorphous and polycrystalline silicon.

8. A method of producing a semiconductor device according to claim 1, wherein said semiconductor layer has a thickness in the range of approximately 0.2 to 1 $\mu$m.

9. A method of producing a semiconductor device according to claim 3, wherein said second laser comprises a pulse laser of carbon dioxide.

10. A method of producing a semiconductor device according to claim 9, wherein said first laser comprises a pulse laser selected from the group comprising YAG and ruby.

11. A method of producing a semiconductor device according to claim 3, wherein said second laser comprises a continuous wave oscillation type laser of carbon dioxide.

12. A method of producing a semiconductor device according to claim 11, wherein said first laser comprises a continuous wave oscillation type laser of argon.

13. A method of producing a semiconductor device according to claim 12, wherein said first laser has a power in the range of 5 to 20 watts.

14. A method of producing a semiconductor device according to claim 11, wherein said second laser has a power in the range of 10 to 90 watts.

15. A method of producing a semiconductor device according to claim 9, wherein said pulse laser of carbon dioxide has an energy in the range of approximately 0.2 to 2 joules/cm$^2$.

16. A method of producing a semiconductor device according to claim 10, wherein said pulse laser of ruby has an energy in the range of approximately 1 to 2 joules/cm$^2$.

17. A method of producing a semiconductor device according to claim 10, wherein said pulse laser of YAG has an energy in the range of approximately 1 to 4 joules/cm$^2$.

18. A method of producing a semiconductor device according to claim 3, wherein by applying said first laser to said semiconductor layer, said semiconductor layer is heated to a specified temperature and by applying said second laser to said insulator layer, said insulator layer is heated to a specified temperature less than or equal to said specified temperature of said semiconductor layer, and wherein the difference between the temperature of said semiconductor layer and the temperature of said insulator layer is within 400° C.

19. A method of producing a semiconductor device comprising the steps of:
    (a) forming a silicon dioxide layer having a thickness of approximately 1 $\mu$m on a silicon substrate having a thickness of approximately 500 $\mu$m, by thermally oxidizing said silicon substrate;
    (b) forming windows extending through said silicon dioxide layer to said silicon substrate;
    (c) forming on said silicon dioxide layer and in said windows by chemical vapor deposition, a polycrystalline layer having a thickness of approximately 1 $\mu$m;
    (d) applying an argon laser beam having approximately a power of 10 watts, a beam width of 100 $\mu$m, and a scanning speed of 10 centimeters/second to said polycrystalline layer;
    (e) simultaneously applying a carbon dioxide laser beam having a power of approximately 50 watts to said silicon dioxide layer.

20. A method of producing a semiconductor device comprising the steps of:
    (a) forming a silicon dioxide layer having a thickness of approximately 0.8 $\mu$m on a silicon substrate having a thickness of approximately 600 $\mu$m, by thermally oxidizing said silicon substrate;
    (b) forming on said silicon dioxide layer by chemical vapor deposition, a polycrystalline layer having a thickness of approximately 0.9 $\mu$m;
    (c) implanting As$^+$ into specified regions of said polycrystalline layer;
    (d) applying a YAG pulse laser having a pulse of approximately 20 ns and an energy density of 4 joules/cm$^2$ to said polycrystalline layer; and
    (e) simultaneously applying a carbon dioxide pulse laser beam having an energy density of approximately 2 joules/cm$^2$ to said silicon dioxide layer, whereby said polycrystalline layer has an electric resistance of approximately 10$^2$ $\Omega$ cm.

21. A method of producing a semiconductor device according to claim 19, wherein step (e) further comprises applying the carbon dioxide laser beam to a region of the silicon dioxide layer underlying a region of the polycrystalline layer to which the argon laser beam is simultaneously applied.

22. A method of producing a semiconductor device according to claim 20, wherein step (e) further comprises applying the carbon dioxide layer beam to a region of the silicon dioxide layer underlying a region of the polycrystalline layer to which the YAG pulse laser beam is similtaneously applied.

* * * * *

UNITED STATES PATENT AND TRADEMARK OFFICE
CERTIFICATE OF CORRECTION

PATENT NO. : 4,375,993
DATED : April 8, 1981
INVENTOR(S) : Haruhisa Mori et al.

It is certified that error appears in the above-identified patent and that said Letters Patent is hereby corrected as shown below:

Front page, [57] ABSTRACT, line 7, "first layer" should be --first laser--;

[57] ABSTRACT, line 7 "semiconductor laser."Should be --semiconductor layer--.

Signed and Sealed this

Fourteenth Day of February 1984

[SEAL]

Attest:

GERALD J. MOSSINGHOFF

Attesting Officer

Commissioner of Patents and Trademarks